(12) United States Patent
Ikeda (10) Patent No.: US 6,385,127 B1
(45) Date of Patent: *May 7, 2002

(54) SYNCHRONOUS SEMICONDUCTOR DEVICE AND METHOD FOR LATCHING INPUT SIGNALS (75) Inventor: Shinichiro Ikeda, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/832,851

(22) Filed: Apr. 12, 2001

(30) Foreign Application Priority Data

Nov. 20, 2000 (JP) ........................................ 2000-352636

(51) Int. Cl.[7] ................................................. G11C 8/00

(52) U.S. Cl. .................... 365/233; 365/189.05; 365/194

(58) Field of Search ............................... 365/194, 233, 365/189.05, 230.08, 191

(56) References Cited

U.S. PATENT DOCUMENTS

| 5,986,943 A | * 11/1999 | Isa ........................ 365/189.04 |
| 6,075,749 A | * 6/2000 | Isa ............................. 365/233 |
| 6,215,723 B1 | * 4/2001 | Kang et al. ............. 365/230.06 |
| 6,216,180 B1 | * 4/2001 | Kendall et al. ............. 365/203 |
| 6,269,031 B1 | * 7/2001 | Fukuhara ................... 365/194 |

FOREIGN PATENT DOCUMENTS

| JP | 8-17182 | 1/1996 |
| JP | 9-153279 | 6/1997 |

* cited by examiner

Primary Examiner—Son Mai
(74) Attorney, Agent, or Firm—Armstrong, Westerman & Hattori, LLP

(57) ABSTRACT

A compact synchronous semiconductor device having an improved set-up/hold time is disclosed. A decoder receives input signals and generates decoded signals. A delay-adjusting unit adjusts the delay time of each of the decoded signals and provides adjusted decoded signals. A latch circuit unit latches the adjusted decoded signals in synchronism with a clock signal.

14 Claims, 4 Drawing Sheets

SYNCHRONOUS SEMICONDUCTOR DEVICE AND METHOD FOR LATCHING INPUT SIGNALS

BACKGROUND OF THE INVENTION

The invention relates to a synchronous semiconductor device, and in particular, to a method of latching an input signal to a synchronous semiconductor device.

In a synchronous semiconductor device such as synchronous dynamic random access memory (SDRAM), there are demands for reducing the set-up time and the set-up/hold time for input signals (command signal and address signal) which follow a clock signal in order to accommodate for the acceleration of the synchronous clock cycle.

Japanese Unexamined Patent Publication No. Hei 8-17182 discloses a synchronous semiconductor device according to a first prior art. A decoder which precedes a latch circuit is provided in the semiconductor circuit to enable a rapid internal operation. As a consequence, the decoding rate of the decoder has a direct influence upon the set-up/hold time.

The first prior art semiconductor device includes a logic circuit disposed between an external command input terminal and the latch circuit. The logic circuit decodes an external command signal fed to each external command input terminal, and the decoded signal is held by the latch circuit in synchronism with the clock signal. This technique is commonly referred to as "command prefetch approach".

Figure 1:
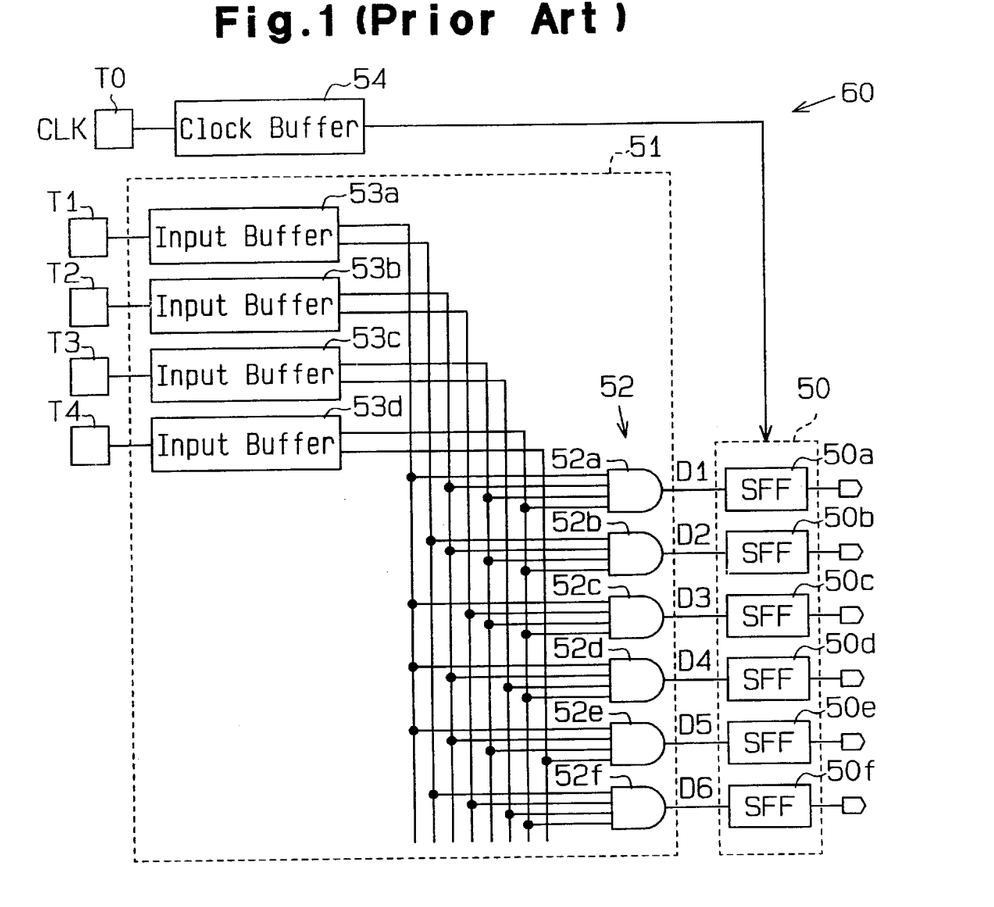
FIG. 1 is a schematic block diagram of a decode circuit and a latch circuit according to a prior art.

FIG. 1 is a block diagram of a command decoder circuit 60 of a synchronous semiconductor device according to a second prior art. The command decoder circuit 60 operates according to the command prefetch approach. Specifically, the command decoder circuit 60 includes a decode circuit 51 connected between four external command input terminals T1–T4 and a latch circuit 50. The decode circuit 51 includes a decode unit 52 having six AND circuits 52a–52f, and four input buffers 53a–53d. Clock signal CLK is fed to an external clock signal input terminal T0 and passed through a clock buffer 54 to the latch circuit 50. External command signals applied to the input terminal T1–T4 are passed through corresponding input buffers 53a–53d, respectively, to the decode unit 52, which then decodes the external command signals to provide decoded signals, which are in turn received and held by the latch circuit 50 in synchronism with the clock signal CLK.

Figure 2:
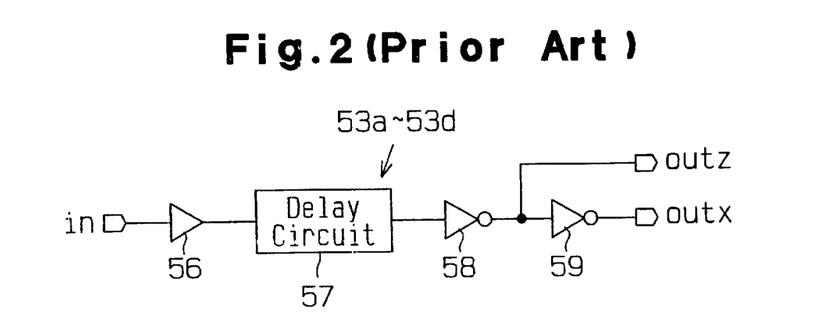
FIG. 2 is a schematic block diagram of an input buffer of the prior art.

FIG. 2 is a block diagram of one of the input buffers 53a–53d. Thus any one of the input buffers 53a–53d includes a level conversion circuit 56, a delay circuit 57 connected to the level conversion circuit 56, an inverter circuit 58 connected to the delay circuit 57 and an inverter circuit 59 connected to the inverter circuit 58. In each of the input buffers 53a–53d, the delay circuit 57 controls the signal input to the decode unit 52, whereby the set-up/hold time for each external command input terminal T1–T4 is controlled.

Japanese Unexamined Patent Publication No. Hei 9-153279 discloses a semiconductor device according to a third prior art. This semiconductor device also includes a decoder which precedes a latch circuit. Specifically, the semiconductor device includes a plurality of external command input terminals, D-type flip-flop circuits each for temporarily storing one of a plurality of external command signals applied to the plurality of external command input terminals, and a plurality of command decode circuits. The D-type flip-flop circuits deliver the plurality of external command signals which they temporarily store to the respective command decode circuits. The plurality of command decode circuits operate to decode the external command signal delivered from the D-type flip flop circuit to provide decoded signals, which are then supplied to a plurality of latch circuits to be held therein. At this time, a clock signal which depends on the delay time of an associated command decode circuit is fed to each latch circuit, thus enabling it to latch the decoded signal in accordance with the corresponding clock signal.

The first prior art semiconductor device has an access time which is more rapid than the access time of a semiconductor device in which a latch circuit precedes a logic circuit. However, a decoder having multiple stages of circuits and elements is connected between the external command input terminal and the latch circuit, and this results in a relatively long time interval or delay time from a point in time when an external command signal is applied to an external command input signal until the logic circuit delivers a decoded signal by decoding the external command signal. As a consequence, the set-up/hold dead zone of the decoded signal relative to the clock signal will be offset toward the set-up side. In other words, the set-up time of the decoded signal will be shortened.

With the semiconductor device according to the first prior art, the delay time within the logic circuit varies from decoded signal to decoded signal as a result of the potential transition situation of the external command input terminals and operational noises of the semiconductor device.

Consequently, the total dead zone in the set-up/hold of the decoded signal relative to the clock signal further increases.

By contrast, in the command decoder circuit 60 shown in FIG. 1, the delay circuit 57 controls the set-up/hold time for each external command terminal. However, a delay time from the transition of the potential of the signal applied to each external command input terminal T1–T4 to the transition of a potential occurring in the decoded signal from each of AND circuits 52a–52f varies from decoded signal to decoded signal. In addition, the delay time of the decoded signal D1–D6 changes depending on the direction of transition of the potential on each external command input terminal T1–T4 (i.e, from H level to L level or from L level to H level).

In addition, the delay time of the decoded signal D1–D6 changes due to operational noises of the semiconductor device such as a variation in the supply voltage, for example. By way of example, if the command decoder circuit 60 is used in a synchronous DRAM, the following difficulties are experienced:

A mode register set command or self-refresh command is applied to a semiconductor device during its idle condition where the operational noises of the semiconductor device remain relatively low. By contrast, an active command, a read/write command or a precharge command is applied to the semiconductor device during its active condition where the operational noises are relatively high. Accordingly, with the active command, the read/write command and the precharge command, a variation in the set-up/hold time attributable to noises in the AND circuits 52a–52f of the decode unit 52 is greater than a corresponding variation experienced by the mode register set command or the self-refresh command. In other words, there is a large variation in the set-up/hold time between different processing commands.

It is difficult to adjust such variation by using a plurality of delay circuits 57 in each of the input buffers 53a–53d which precedes the decode unit 52. Specifically, to accommodate for such variation, it would be necessary to choose an individual delay time for each of the plurality of delay circuits 57, but in practice, such control would be difficult, and there remains a certain variation, which causes the dead zone breadth of the set-up/hold to increase when viewed from the whole assembly of external command input terminals T1–T4. If the command decoder circuit 60 is used in an address decode circuit or a variety of test mode decision circuits, a similar problem occurs.

For a semiconductor device including the input buffers 53a–53d as shown in FIG. 2, there is a difference between a positive logic output circuit and a negative logic output circuit in the number of stages of constituting circuit elements. Obviously, there results an offset in the output timing between the positive logic output circuit and the negative logic output circuit, and this leads to an offset between the operations of AND circuits 52a–52f which receive complimentary logic signals. Specifically, with the AND circuits 52a–52f, when producing a decoded output signal having an L level (or when selecting two input signals each having an L level), the transition of the decoded output signal is fastest while degrading the hold time. On the contrary, when producing a decoded output signal having an H level (or when selecting two input signals each having an H level), the transition of the decoded output signal is slowest while degrading the set-up time.

The latch circuit 50 includes latches 50a–50f each associated with AND circuits 52a–52f.

On the other hand, in the semiconductor device according to the third prior art, while the delay time can be adjusted for each external command terminal, the set-up/hold time for each external clock signal is determined by the D-type flip-flop circuit. In other words, it is impossible to adjust the set-up/hold time for each command with the semiconductor device according to the third prior art.

Furthermore, in the semiconductor device according to the third prior art, each command decode circuit follows the D-type flip-flop circuit. Each latch circuit latches an output signal from the corresponding command decode circuit, and at this end, each latch circuit is supplied with a clock signal which takes the delay time into consideration. However, such clock signal is required to have the same delay time as the set-up/hold window width that is determined by the D-type flip-flop circuit. In addition, it is necessary to provide a number of clock signal generator circuits which is equal to the number of the latch circuits. Because the clock signal generator circuit requires a relatively increased number of elements, it follows that the circuit area for a synchronous DRAM, which is provided with a number of commands and address, decodes increases.

SUMMARY OF THE INVENTION

It is an object of the invention to provide a synchronous semiconductor device that is compact and has an improved set-up/hold time.

To achieve the above object, the present invention provides a synchronous semiconductor device including a decoder, a delay adjusting unit, and a latch circuit unit. The decoder receives a plurality of input signals and produces a plurality of decoded signals. The delay adjusting unit is connected to the decoder and adjusts a delay time of each of the decoded signals and provides a plurality of adjusted decoded signals. The latch circuit unit is connected to the delay adjusting unit and latches the adjusted decoded signals in synchronism with a clock signal. The decoder typically includes a plurality of decode circuits, and the delay adjusting unit includes a plurality of delay adjusting circuits, each of which is connected with each of the decode circuits. The latch circuit unit includes a plurality of latch circuits, each of which is connected with each of the delay adjusting circuits. The input signal includes one of an address signal and a command signal used to operate a synchronous semiconductor memory. One of the decoded circuits will operate when the input signal is decoded. The synchronous semiconductor device further includes a plurality of command input terminals for receiving the command input signals.

The delay adjusting circuit includes an input terminal to which the decoded signal is provided, an output signal from which the decoded signal is output, at least one switching element connected to at least one node between the input terminal and the output terminal, and at least one capacitor, which can be a MOS capacitor, connected to the switching element and the ground. The delay adjusting circuit adjusts the delay time of the associated decoded signals depending on the operational condition of the synchronous semiconductor device, and the delay time is changed when the switching element is switched.

The synchronous semiconductor device described above is used to latching a plurality of input signals. The input signals are first decoded to provide decoded signals. The delay time of each of the decoded signals is adjusted so that a variation in the set-up/hold time for the decoded signals is reduced, thus providing adjusted decoded signals. The adjusted decoded signals are then latched in synchronism with a clock signal. The delay time of each decoded signal is adjusted depending on the operational condition of the synchronous semiconductor device.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 3:
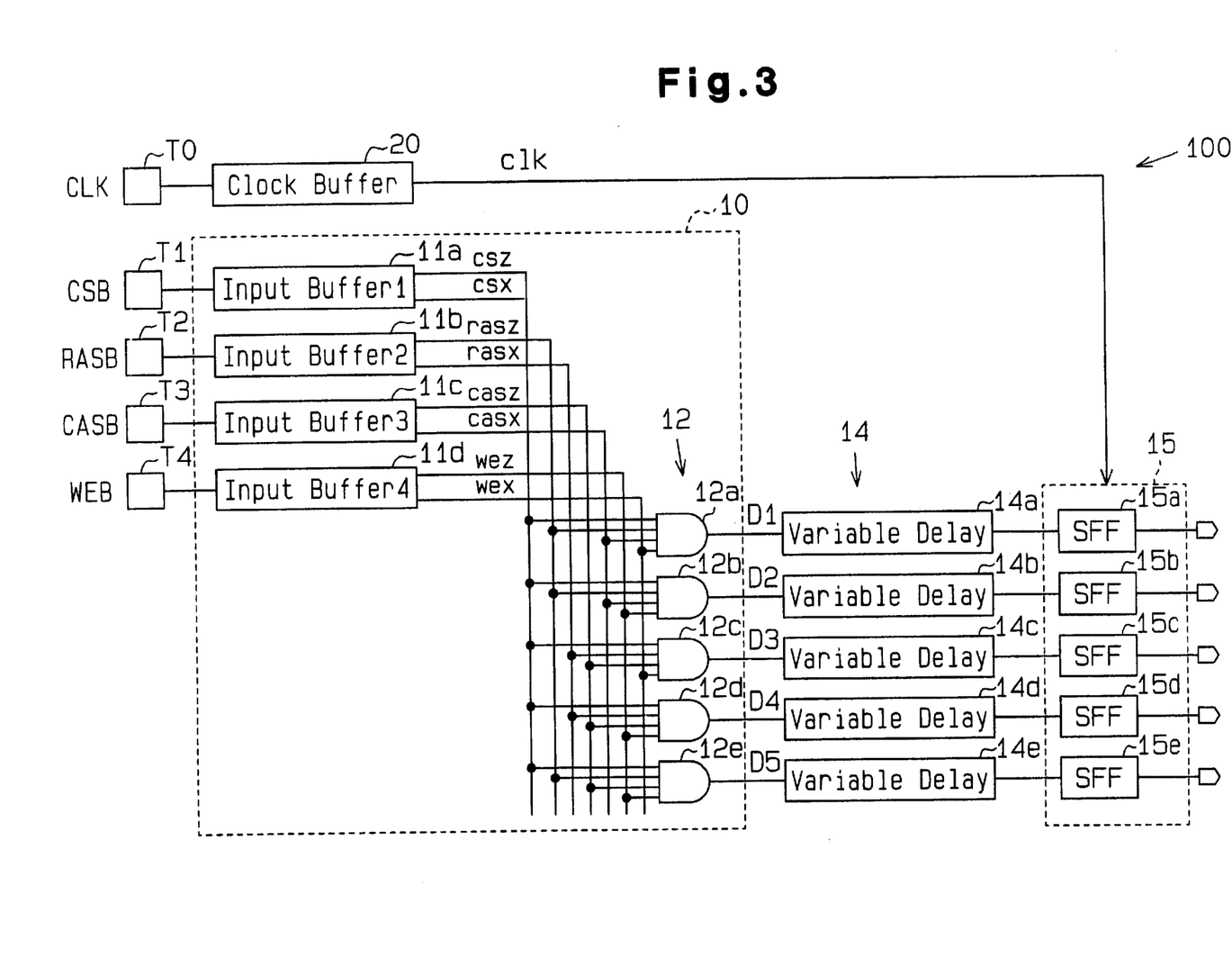
FIG. 3 is a schematic block diagram of a command decode circuit for a synchronous DRAM according to a first embodiment of the present invention.

A synchronous DRAM according to a first embodiment of the invention will now be described. FIG. 3 is a block diagram of a command decode circuit 100 for a synchronous DRAM.

The command decode circuit 100 has an external clock signal input terminal T0, and four or first to fourth external command input terminals T1–T4. The external clock terminal T0 receives an external clock signal CLK from an external unit, not shown. The first to the fourth external command input terminal T1–T4 receive external command signals from an external unit. In the first embodiment, the external command signals include a chip select signal CSB, a row address strobe signal RASB, a column address strobe signal CASB and a write enable signal WEB. The command decode circuit 100 decodes external command signals to provide decoded signals.

The external commands also include an active command, a read command, a write command, a precharge command, and a mode register set command. An active command activates a synchronous DRAM in response to an access demand from an external unit, downloads a row address during the same cycle through a separate route, not shown, to select any desired word line and allows a memory cell data to be amplified by a sense amp.

A read command follows the active command to download a column address to deliver the memory cell data. A write command follows the active command to download a column address and data to be written to cause the data to be written into a selected memory cell. A precharge command follows either one of the active command, the read command and the write command to deactivate a word line or a bit line, thereby initializing internal nodes within the synchronous DRAM. The mode register set command occurs during one of the active command, the read command and the write command to set up parameters to control the internal circuit of the synchronous DRAM closely.

The command decoder circuit 100 includes a decode unit 10 connected to the first to the fourth external command input terminal T1–T4, a set-up/hold latch circuit 15 connected to the external clock signal input terminal T0 and a delay adjusting unit 14 connected between the decode unit 10 and the set-up/hold latch circuit 15.

The decode unit 10 includes a first to a fourth input buffer 11a–11d, and a decode circuit 12 including a first to a fifth AND circuit 12a–12e. Each of the first to the fourth input buffer 11a–11d has a single input terminal and a pair of output terminals. The input terminal of the first input buffer 11a is connected to the first external command input terminal T1 to receive a chip select signal CSB. The input terminal of the second input buffer 11b is connected to the second external command input terminal T2 to receive a row address strobe signal RASB. The input terminal of the third input buffer 11c is connected to the third external command input terminal T3 to receive a column address strobe signal CASB. The input terminal of the fourth input buffer 11d is connected to the fourth external command input terminal T4 to receive a write enable signal WEB.

Figure 4:
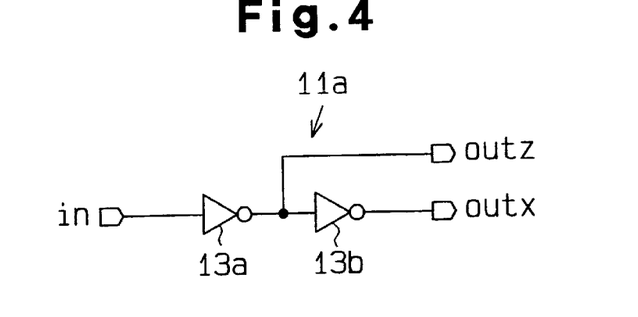
FIG. 4 is a schematic block diagram of an input buffer shown in FIG. 3.

FIG. 4 is a block diagram of the first input buffer 11a. It is to be understood that the second to the fourth input buffer 11b–11d are similarly constructed as the first input buffer 11a. Specifically, the first input buffer 11a includes a pair of inverter circuits 13a, 13b, thereby producing two complimentary signals outz, outx from a single input signal in. More specifically, the first input buffer 11a produces an inversion of the chip select signal CSB (or inverted chip select signal csz) and a signal which is in phase with the chip select signal CSB (or a chip select signal csx). The second input buffer 11b produces an inversion of the row address strobe signal RASB (or an inverted row address strobe signal rasz) and a signal in phase with the row address strobe signal RASB (or a row address strobe signal rasx). The third input buffer 11c produces an inversion of the column address strobe signal CASB (or an inverted column address strobe signal casz) and a signal in phase with the column address strobe signal CASB (or a column address strobe signal casx). The fourth input buffer 11d produces an inversion of the write address enable signal WEB (or an inverted write enable signal wez) and a signal in phase with the write enable signal WEB (or a write enable signal wex).

Output signals csz, rasz, rasx, casz, casx, wez, and wex from the first to the fourth input buffers 11a–11d are supplied to the decode circuit 12. Accordingly, the external commands (specifically the chip select signal CSB, the row address strobe signal RASB, the column address strobe signal CASB and the write enable signal WEB) are decoded in the decode circuit 12.

The first AND circuit 12a receives the inverted chip select signal csz, the inverted row address strobe signal rasz, the column address strobe signal casx and the write enable signal wex to produce a decoded signal D1 which assumes an H level when all of the signals csz, rasz, casx and wex are at H levels.

The second AND circuit 12b receives the inverted chip select signal csz, the inverted row address strobe signal rasz, the column address strobe signal casx and the inverted write enable signal wez to produce a decoded signal D2 which assumes an H level when all of the signals csz, rasz, casx and wez are at H levels.

The third AND circuit 12c receives the inverted chip select signal csz, the row address strobe signal rasx, the inverted column address strobe signal casz and the write enable signal wex to produce a decoded signal D3 which assumes an H level when all of the signals csz, rasx, casz and wex are at H levels.

The fourth AND circuit 12d receives the inverted chip select signal csz, the row address strobe signal rasx, the inverted column address strobe signal casz and the inverted write enable signal wez to produce a decoded signal D4 which assumes an H level when all of the signals csz, rasx, casz and wez are at H levels.

The fifth AND circuit 12e receives the inverted chip select signal csz, the inverted row address strobe signal rasz, the inverted column address strobe signal casz and the inverted write enable signal wez to produce a decoded signal D5 which assumes an H level when all of the signals csz, rasz, casz and wez are at H levels.

The decode circuit 12 decodes various external commands in a manner such that one of the decoded signals D1–D5 rises to its H level while the remaining decoded signals D1–D5 fall to their L level.

By way of example, when the external command is an active command, the decode circuit 12 produces the decoded signal D1 of an H level and decoded signals D2–D5 of an L level. When the external command is a precharge command, the decode circuit 12 produces the decoded signal D2 of an H level, and decoded signals D1, D3–D5 of an L level. When the external command is a read command, the decode circuit 12 produces the decoded signal D3 of an H level and decoded signals D1, D2–D4 and D5 of an L level. When the external command is a write command, the decode circuit 12 produces the decoded signal D4 of an H level and decoded signals D1–D3 and D5 of an L level. When the external command is a mode register set command, the decode circuit 12 produces the decoded signal D5 of an H level and decoded signals D1–D4 of an L level.

The decode circuit 12 delivers the decoded signals D1–D5 to the set-up/hold latch circuit 15 through a delay adjusting unit 14. More specifically, decoded signals D1–D5 from the AND circuits 12a–12e are supplied to the set-up/hold latch circuit 15 through the corresponding ones of a first to a fifth variable delay circuit 14a–14e.

The set-up/hold latch circuit 15 will now be described.

The set-up/hold latch circuit 15 includes five SFF circuits 15a–15e, each of which is latched with one of the decoded signals D1–D5 in synchronism with the external clock signal CLK. Specifically, a clock buffer 20 receives an external clock signal CLK and produces an internal clock signal clk which is in phase with the external clock signal CLK. The clock buffer 20 delivers the internal clock signal clk to each of SFF circuits 15a–15e.

Figure 6:
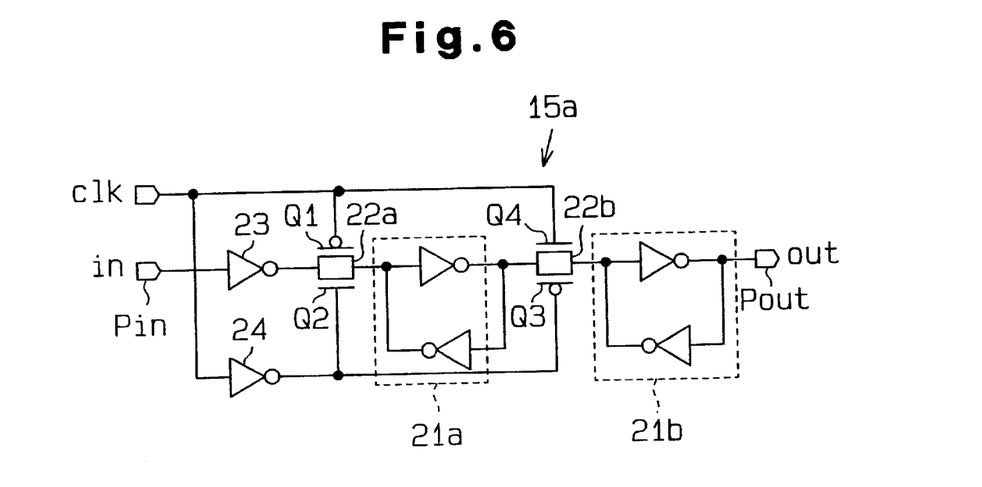
FIG. 6 is a schematic block diagram of an SFF circuit shown in FIG. 3.

FIG. 6 is a schematic diagram of SFF circuit 15a. It is to be understood that remaining SFF circuits 15b–15e are constructed in the same manner as the SFF circuit 15a. The SFF circuit 15a includes a pair of latches 21a, 21b, a pair of transfer gates 22a, 22b and a pair of inversion circuits 23, 24. Each SFF circuit 15a–15e has an input terminal Pin which is connected to the corresponding variable delay circuit 14a.

The first and the second latch 21a, 21b each include a pair of inverter circuits. The first latch 21a is connected between the first transfer gate 22a and the second transfer gate 22b. In other words, the first latch 21a is connected to the input terminal Pin through the first transfer gate 22a and the invertion circuit 23. The second latch 21b is connected between the second transfer gate 22b and an output terminal Pout of the SFF circuit 15a. The output terminal Pout is connected to an internal circuit, not shown.

The first transfer gate 22a includes an P-channel MOS (PMOS) transistor Q1 and an N-channel MOS (NMOS) transistor Q2. The PMOS transistor Q1 has a gate, to which the internal clock signal clk is applied. On the other hand, the inverted internal clock signal clk is applied to the gate of NMOS transistor Q2 through the invertion circuit 24.

The second transfer gate 22b includes an PMOS transistor Q3 and an NMOS transistor Q4. The inverted internal clock signal clk is applied to the gate of PMOS transistor Q3 through the invertion circuit 24 while the internal clock signal clk is applied to the gate of NMOS transistor Q4.

When the internal clock signal clk assumes an L level, the first transfer gate 22a is opened while the second transfer gate 22b is closed. In this instance, the first latch 21a holds the inverted decoded signal. When the internal clock signal clk changes from its L level to its H level, the second transfer gate 22b is opened while the first transfer gate 22a is closed. At this time, the second latch 21b receives the decoded signal which has been held by the first latch 21a and continues to hold such decoded signal. In this manner, respective decoded signals D1–D5 are latched into a corresponding second latch 21b in response to the rising edge of the internal clock signal clk.

The set-up/hold time is adjusted by the adjusting unit 14 (or the first to the fifth variable delay circuit 14a–14e). Accordingly, a result of detection (decoded signals D1–D5) from the decode circuit 12 is held by the SFF circuits 15a–15e in a positive manner in response to the rising edge of the internal clock signal clk.

The delay adjusting unit 14 will now be described. The delay adjusting unit 14 includes a first to a fifth variable delay circuit 14a–14e.

The first variable delay circuit 14a receives the decoded signal D1 from the first AND circuit 12a and feeds it to the first SFF circuit 15a without or with a delay. Similarly, the second to the fifth variable delay circuit 14b–14e receive the decoded signal D2–D5, respectively, from the second to the fifth AND circuit 12b–12e, respectively, and feed the decoded signal D2–D5 to the second to the fifth SFF circuit 15b–15e, respectively, without or with a delay.

Figure 5:
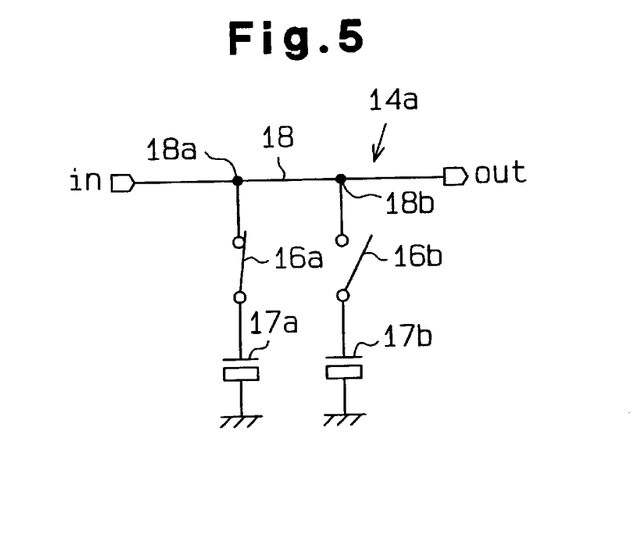
FIG. 5 is a schematic block diagram of a variable delay circuit shown in FIG. 3.

FIG. 5 is a schematic diagram of the first variable delay circuit 14a. It is to be understood that the second to the fifth variable delay circuit 14b–14e are constructed in the similar manner as the first variable delay circuit 14a. The first variable delay circuit 14a has an input terminal in which is connected to the AND circuit 12a and an output terminal out which is connected to the SFF circuit 15a. The first variable delay circuit 14a includes a pair of switch elements 16a, 16b and a pair of MOS capacitors 17a, 17b. Specifically, the switch elements 16a, 16b are connected to nodes 18a, 18b on a signal line 18 which joins the input terminal in and the output terminal out, and the pair of MOS capacitors 17a, 17b are connected between the respective switch elements 16a, 16b and the ground. Preferably, each switch element 16a, 16b includes an MOS transistor.

An adjustment of the set-up/hold time will now be described.

The delay time or the set-up/hold time of the decoded signals D1–D5 is adjusted by each variable delay circuit 14a–14e. In the variable delay circuit 14a–14e, the delay time is adjusted by selectively turning the switch elements 16a, 16b on and/or off. More specifically, when the both switch elements 16a, 16b are turned off, a shortest delay time is set up. When the both switch elements 16a, 16b are turned on, a longest delay time is set up. When one of the switch elements 16a, 16b is turned off while the other is turned on, the resulting delay time is intermediate the longest and the shortest delay time.

In the first embodiment, for each external command, the first to the fifth AND circuit 12a–12e produces one decoded signal D1–D5 of an H level and four decoded signals of an L level. Paying attention to this fact, it is examined in a test mode if one of the SFF circuits 15a–15e is capable of holding one of the decoded signals, which has an H level in accordance with the external command, in accordance with the internal clock signal clk. The delay times of the variable delay circuits 14a–14e are determined so that the SFF circuit is capable of holding the decoded signal having an H level in accordance with the internal clock signal clk.

Specifically, when the external command is an active command, only the decoded signal D1 assumes an H level. The external clock signal CLK and the active command are supplied to the synchronous DRAM. The delay time of the first variable delay circuit 14a is adjusted so that the first SFF circuit 15a is capable of holding the decoded signal D1 in accordance with the internal clock signal clk.

When the external command is a precharge command, only the decoded signal D2 assumes an H level. The external clock signal CLK and the precharge command are supplied to the synchronous DRAM. The delay time in the second variable delay circuit 14b is adjusted so that the second SFF circuit 15b holds the decoded signal D2 in accordance with the internal clock signal clk.

When the external command is a read command, only the decoded signal D3 assumes an H level. The external clock signal CLK and the read command are supplied to the synchronous DRAM. The delay time of the third variable delay circuit 14c is adjusted so that the third SFF circuit 15c holds the decoded signal D3 in accordance with the internal clock signal clk.

When the external command is a read command, only the decoded signal D3 assumes an H level. The external clock signal CLK and the read command are supplied to the synchronous DRAM. The delay time of the third variable delay circuit 14c is adjusted so that the third SFF circuit 15c holds the decoded signal D3 in accordance with the internal clock signal clk.

When the external command is a write command, only the decoded signal D4 assumes an H level. The external clock signal CLK and the write command are supplied to the synchronous DRAM. The delay time of the fourth variable delay circuit 14d is adjusted so that the fourth SFF circuit 15d holds the decoded signal D4 in accordance with the internal clock signal clk.

When the external command is a mode register set command, only the decoded signal D5 assumes an H level. The external clock signal CLK and the mode register set command are supplied to the synchronous DRAM. The delay time of the fifth variable delay circuit 14e is adjusted so that the fifth SFF circuit 15c holds the decoded signal D5 in accordance with the internal clock signal clk.

The delay time for each of the decoded signals D1–D5 is defined as a length of time passed from the transition of the potential of the command signal applied to one of the external command input terminal T1–T4 to the transition of the potential of the decoded signal D1–D5 delivered from the AND circuits 12a–12e. It should be noted that the delay time is different between decoded signals D1–D5. In addition, the delay time also varies depending on the direction of transition (from H level or L level or L level to H level) on the external command input terminals T1–T4.

The delay time also varies due to operational noises of the synchronous DRAM such as a variation in the supply voltage, for example. In other words, depending on the operational condition of the semiconductor device as the potential of the decoded signal D1–D5 transitions, the influence of the noises upon the delay time varies from decoded signal to decoded signal.

Specifically, when the mode register set command is applied to the semiconductor device, the semiconductor device is in an idle condition where the operational noises within the semiconductor device are relatively low. By contrast, when the active command, the read/write command and precharge command are applied to the semiconductor device, the semiconductor device is in an active condition where the operational noises are relatively high. As a consequence, when the mode register set command is applied, the set-up/hold time is less susceptible to the influence of noises. However, conversely, when the active command, the read/write command or precharge command is applied, the set-up/hold time of each AND circuit 12a–12e is greatly influenced by the noises. This means that when the active command, the read/write command and precharge command are asserted, the set-up/hold time is susceptible to variation.

A variation in the set-up/hold time is reduced by using the variable delay circuits 14a–14e to adjust the delay time (set-up/hold time) for each command. In this manner, the SFF circuits 15a–15e are enabled to hold each decoded signal having an H level in conformity to the internal clock signal clk. As a consequence, the command decode circuit 100 exhibits a reduced dead zone width for the set-up/hold when viewed from the entire external command input terminals T1–T4.

The synchronous DRAM according to the first embodiment has the following advantages:

(1) The first to the fifth variable circuit 14a–14e are connected between the decode unit 10 and the set-up/hold latch circuit 15. The command decode circuit 100 has a number of circuit elements which is less than the number of circuit elements used in the third prior art, and thus there are provided a relatively compact command decode circuit 100 and hence SDRAM. Since the delay time is adjusted for each decoded signal in the command decode circuit 100, the dead zone width of the set-up/hold time as viewed from the entire input terminals T1–T4 is relatively narrow.

(2) Using the first to the fifth variable delay circuit 14a–14e, the delay time (set-up/hold time) is adjusted for each command. Accordingly, if the operational noises such as a variation in the supply voltage of the synchronous DRAM differ from command to command, there is provided an optimum adjustment of the delay time. As a consequence, a variation in the set-up/hold time from command to command is reduced, and the decoded signals D1–D5 can be latched in the set-up/hold latch circuit 15.

(3) Each of the delay circuits 14a–14e includes the switch elements 16a, 16b and MOS capacitors 17a, 17b, and is relatively simple in construction. The incorporation of MOS capacitors 17a, 17b is facilitated.

(4) In the first embodiment, only one of the first to the fifth AND circuit 12a–12e operates in response to a variety of external commands. Accordingly, the decode circuit 12 has a relatively low power dissipation. It will be noted that only one of the delay circuits which is associated with the operating AND circuit operates. Accordingly, the power dissipation of the delay circuits 14a–14e is also relatively low.

The first embodiment mentioned above can be modified in the manner mentioned below.

The input buffers 11a–11d may deliver a single phase signal. The input buffer may include a delay circuit. Where a level conversion of an external signal is unnecessary, the input buffers 11a–11d can be omitted.

AND circuit 12a–12e may be replaced by a decode circuit 12 which employ other logic circuits.

The variable delay circuits 14a–14e are not limited to those shown in FIG. 5. For example, the switch elements 16a, 16b may be replaced by fuses. In this instance, the fuse which is connected to MOS capacitors 17a, 17b which is turned off is cut by a laser. MOS capacitors 17a, 17b may be replaced by capacitors other than MOS capacitors. In addition, a delay circuit or set/reset delay circuit which employs an inverter circuit may be used.

SFF circuits 15a–15e latch the decoded signals D1–D5 in response to the rising edge of the internal clock signal clk. However, as an alternative, SFF circuits 15a–15e may latch the decoded signals D1–D5 in response to the falling edge of the internal clock signal clk, for example.

The invention is not limited to its application to a command decode circuit 100 for the synchronous DRAM, but may also be applied to an address decode circuit of such DRAM or to a variety of test mode decision circuits.

Figure 7:
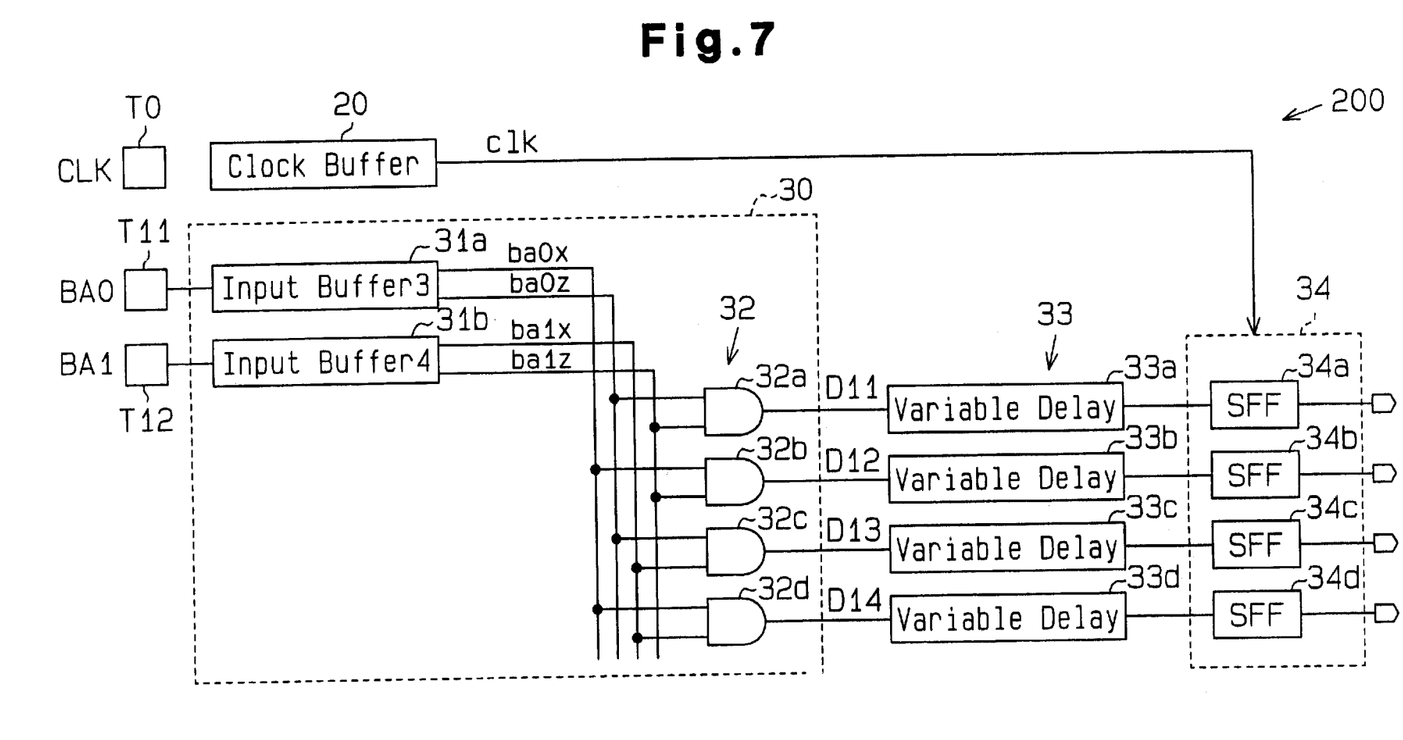
FIG. 7 is a schematic block diagram of an address decode circuit for a synchronous DRAM according to a second embodiment of the present invention.

By way of example, FIG. 7 is a block diagram of an address decode circuit 200 according to a second embodiment of the invention. The address decode circuit 200 includes a decode unit 30, a delay adjusting unit 33 and a set-up/hold latch circuit 34. An external address signal BA0 and BA1 are supplied to a first and a second external address terminal T11 and T12, respectively.

The decode unit 30 includes a first and a second input buffer 31a, 31b, and a first to a fourth AND circuit 32a–32d. The first input buffer 31a produces complimentary address signals ba0x, ba0zfrom an external address signal BA0. The second input buffer 31b produces complimentary address signals ba1x, ba1z from the external address signal BA1. Each of AND circuits 32a–32d represents a two input AND circuit and receives address signals ba0x, ba0z, ba1x and ba1z in different combinations. Each of AND circuits 32a–32d produces one of decoded signals D11–D14 of an H level when two address signals assume an H level.

The delay adjusting unit 33 includes a first to a fourth variable delay circuit 33a–33d. The set-up/hold latch circuit 34 includes a first to a fourth SFF circuit 34a–34d. The SFF circuits 34a–34d latch respective decoded signals D11–D14 supplied from corresponding variable delay circuits 33a–33d in synchronism with the external clock signal CLK.

It will be understood that in the address decode circuit 200, the difference in the number of inverter circuits within the input buffers 31a and 31b causes a variation in the set-up/hold time of the external address signal. In order to assure that a result of detection (decoded signal D11–D14) of the decode unit 30 be positively held in response to the rising edge of the internal clock signal clk, the set-up/hold time is adjusted by using the variable delay circuits 33a to 33d in the similar manner as in the first embodiment. Accordingly, the second embodiment provides the same advantage as achieved by the first embodiment.

The command decode circuit 100 of the synchronous DRAM may be formed on a single semiconductor substrate, or may be formed on the semiconductor substrate in mixture with the logic circuit.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A synchronous semiconductor device comprising:
   a decoder for receiving a plurality of input signals to generate a plurality of decoded signals;
   a delay adjusting unit, which receives a clock signal and is connected to the decoder to adjust a delay time of each of the decoded signals and to provide a plurality of adjusted decoded signals; and
   a latch circuit unit connected to the delay adjusting unit for latching the adjusted decoded signals in synchronism with the clock signal.

2. A synchronous semiconductor device comprising:
   a plurality of decode circuits for receiving a plurality of input signals and for producing a plurality of decoded signals;
   a plurality of delay adjusting circuits connected to the plurality of decode circuits, respectively, to adjust the respective delay times of the plurality of decode signals so that a variation in the set-up/hold time of the plurality of decode signals is reduced, thus providing a plurality of adjusted decoded signals; and
   a plurality of latch circuits, which receive a clock signal and are connected to the plurality of delay adjusting circuits for latching the plurality of adjusted decoded signals, respectively, in synchronism with the clock signal.

3. A synchronous semiconductor device according to claim 2, wherein each of the delay adjusting circuits adjusts the delay time of an associated one of the decoded signals depending on the operational condition of the synchronous semiconductor device.

4. A synchronous semiconductor device according to claim 2, wherein each of the delay adjusting circuits includes a capacitor that delays an associated one of the decoded signals.

5. A synchronous semiconductor device according to claim 2, wherein each of the plurality of delay adjusting circuits includes:
   an input terminal to which the decoded signal is provided;
   an output terminal from which the decoded signal is output;
   at least one switching element connected to at least one node between the input terminal and the output terminal; and
   at least one capacitor connected to the at least one switching element, the at least one switching element selectively connecting the at least one capacitor and the at least one node.

6. A synchronous semiconductor device according to claim 5, wherein the delay time is changed as the at least one switching element is switched.

7. A synchronous semiconductor device according to claim 5, wherein the capacitor includes MOS capacitor.

8. A synchronous semiconductor device according to claim 2, wherein when the input signal is to be decoded, one of the plurality of decode circuits operates.

9. A synchronous semiconductor device according to claim 2, wherein the input signal is at least one of an address signal and a command signal that are used to operate a synchronous semiconductor memory.

10. A method of latching a plurality of input signals in a synchronous semiconductor device, comprising the steps of:
    decoding the plurality of input signals to provide a plurality of decoded signals;
    adjusting a delay time of each of the decoded signals so that a variation in the set-up/hold time for the decoded signals is reduced, thus providing a plurality of adjusted decoded signals;
    receiving the adjusted decoded signals and a clock signal; and
    latching the adjusted decoded signals in synchronism with the clock signal.

11. A method of latching the plurality of input signals according to claim 10, wherein the delay time is adjusted in the manner depending on the operational condition of the synchronous semiconductor device.

12. A synchronous semiconductor device comprising:
    a plurality of command input terminals for receiving a plurality of command signals;
    a plurality of decode circuits connected to the command input terminals, respectively, to decode the command signals, thereby providing a plurality of decoded signals;
    a plurality of delay adjusting circuits connected to the decode circuits to adjust a delay time of each of the decoded signals in a manner dependent on the variety of the command signals, thereby providing a plurality of adjusted decoded signals; and
    a plurality of latch circuits, which receive a clock signal and are connected to the delay adjusting circuits for latching the adjusted decoded signals in synchronism with the clock signal.

13. A synchronous semiconductor device according to claim 12, wherein each of the delay adjusting circuits includes a capacitor for delaying an associated one of the decoded signals.

14. A synchronous semiconductor device according to claim 12, wherein each of the delay adjusting circuits includes:

an input terminal for receiving an associated one of the decoded signals;

an output terminal connected to an associated one of the latch circuits;

a plurality of MOS transistors connected to the ground; and a plurality of switching elements connected between a plurality of nodes, which are defined between the input terminals and the output terminals, and the MOS transistors, for selectively connecting the nodes and the MOS transistors.

\* \* \* \* \*